United States Patent [19]
Jensen

[11] Patent Number: 5,124,576
[45] Date of Patent: Jun. 23, 1992

[54] TRACK AND HOLD AMPLIFIER

[75] Inventor: Russell H. Jensen, Kernersville, N.C.

[73] Assignee: Unitrode Corporation, Billerica, Mass.

[21] Appl. No.: 675,421

[22] Filed: Mar. 26, 1991

[51] Int. Cl.[5] .................... H03K 5/159; H03K 5/153; H03K 5/08
[52] U.S. Cl. .................... 307/353; 307/356; 307/359; 307/553
[58] Field of Search ............... 307/353, 356, 359, 493, 307/499, 544, 553; 328/175

[56] References Cited

U.S. PATENT DOCUMENTS

| | | | |
|---|---|---|---|
| 3,659,117 | 4/1972 | Caveney et al. | 307/353 |
| 3,851,260 | 11/1974 | Colin | 307/353 |
| 4,763,106 | 8/1988 | Gulczynski | 340/347 AD |
| 4,763,107 | 8/1988 | Koen et al. | 340/347 AD |
| 4,779,012 | 10/1988 | Moscovici | 307/353 |
| 4,783,602 | 11/1988 | Viswanathan | 307/353 |
| 4,857,931 | 8/1989 | Gulczynski | 341/156 |
| 4,862,016 | 8/1989 | Genrich | 307/353 |
| 4,885,545 | 12/1989 | Sanielevici | 307/353 |
| 5,036,219 | 7/1991 | Dingwall et al. | 307/353 |

Primary Examiner—Eugene R. LaRoche
Assistant Examiner—Evelyn A. Lester
Attorney, Agent, or Firm—Weingarten, Schurgin, Gagnebin & Hayes

[57] ABSTRACT

An improved fast track and hold amplifier having a hold capacitor in which in one embodiment a diode switching bridge is connected in a feedback loop of a transimpedance amplifier and in which in another embodiment a feedback resistor is connected in the feedback loop of a transimpedance amplifier is disclosed. The transimpedance amplifier provides a current signal representative of the current necessary to drive the voltage on the hold capacitor to the level of the input analog signal, and current mirrors connected to the hold capacitor respond to the current signal to charge up the hold capacitor to the level of the input signal by supplying a charging current to the hold capacitor that is a multiple of the current necessary. Devices constructed in accordance with the invention exhibit slew rates, droop rates and bandwidths comparable to or better than those of the heretofore known devices but at substantially lower power levels than heretofore possible.

28 Claims, 3 Drawing Sheets

TRACK AND HOLD AMPLIFIER

FIELD OF THE INVENTION

This invention is directed to the field of amplifiers, and more particularly, to an improved track and hold amplifier.

BACKGROUND OF THE INVENTION

To the extent that in a track mode it acquires a value of an input analog signal and in a hold mode it stores it for a length of time, a track and hold amplifier may be thought of as a dynamic analog memory. The "slew rate" is the term given to the speed with which it acquires and the "acquisition time" is the term given to the time which it takes to acquire the value of the voltage of the impressed analog signal in the track mode. The "droop rate" is the term given to the temporal stability of the acquired value of the voltage in the hold mode. The greater the slew rate and bandwidth and the lesser the acquisition time, droop rate and power, the better a fast track and hold amplifier is able to cyclically perform its signal tracking and holding functions.

Among others, track and hold amplifiers find application in analog-to-digital (A/D) converters. For this application, the track and hold amplifier samples an input analog signal and stores its value long enough to allow for the analog-to-digital (A/D) conversion thereof. By way of example, Micro Networks, the instant assignee, provides a fast track and hold amplifier identified as the "Micro Networks MNHT1010" Track and Hold, believed to presently be the fastest commercially-available device, that exhibits a slew rate of 1000 V/$\mu$Sec, a small signal bandwidth of 200 MHz, an acquisition time of 10 nSec to 0.1%, a droop rate of 500 mV/mSec and a power dissipation of 2.3 W.

The heretofore known fast track and hold amplifiers employ an open-loop architecture in which the input signal to be tracked and held is impressed through an input buffer to one signal node of a diode switching bridge. A hold capacitor is connected to the other signal node of the diode switching bridge. The output signal is available at the output of a unitary-gain FET buffer the input of which is connected to the hold capacitor. Fixed current sources are connected to the feed nodes of the diode switching bridge. The input buffer isolates the impressed analog input signal from bridge transients produced by bridge switching, and the output buffer presents both a high input impedance and a low output impedance to enable optimum coupling to downstream electronic subsystems, such as an A/D conversion subsystem.

In the track mode, the diodes of the diode switching bridge are forward-biased, so that the fixed current sources are electrically connected to the hold capacitor. The voltage across the hold capacitance is thereby constrained to be the same as the impressed input analog voltage, and the fixed current sources supply the charge that enables the same to charge up to the value of the voltage of the impressed analog signal.

In the hold mode, the diodes of the diode switching bridge are reverse-biased, so that on the one hand the fixed current sources are electrically disconnected from the hold capacitor and on the other the hold capacitor is electrically disconnected from the input buffer. With the input to the hold capacitor in the open-circuit condition, the hold capacitor is thereby enabled to hold the corresponding sampled value of the voltage of the impressed analog signal.

The slew rate of the heretofore known open-loop track and hold amplifiers has been fixed by the particular ratio of the magnitude of the current selected for the fixed current sources that supply charge to the hold capacitor to the value of the capacitance selected for the hold capacitor. On the one hand, the higher the value of the magnitude of the current the faster the slew rate that the heretofore known open-loop track and hold amplifiers exhibit. However, the current magnitude, and corresponding slew rate, are fundamentally limited by the power handling capability of the constitutive diodes and switching transistors of the diode switching bridge of the heretofore known open-loop fast track and hold amplifiers. Beyond an upper current bound, these devices generate more heat they are able to dissipate, which places an upper bound on the slew rate for a given value of capacitance. On the other hand, the smaller the value of the hold capacitance the faster is the corresponding slew rate and the larger is the corresponding droop rate of the heretofore known open-loop fast track and hold amplifiers. However, in a practicable embodiment, a range is imposed on the possible values that can be selected for the capacitance of the hold capacitors of the heretofore known open-loop track and hold amplifiers. The maximum boundary for the range of hold capacitance is determined by the selection criteria that it must be big enough to handle the magnitude of the current selected to provide an acceptable slew rate, and the minimum boundary of the range of track and hold capacitance is determined by the selection criteria that it must not be so small as to fail to provide an acceptable droop rate.

The bandwidth of the heretofore open-loop fast track and hold amplifiers has been limited by the nature of the analog signal path that is seen by the impressed analog signal. The output resistance of the input buffer is in series with the resistance of the diode bridge. This combined resistance forms an RC filter with the hold capacitor. In addition to these nominal resistances an added isolation resistor is sometimes necessary between the input buffer and the diode switching bridge to provide critical dampening for best acquisition time. The values of the resistances and of the hold capacitor produce a pole in the analog signal path that places an upper bound on the bandwidth of the heretofore known open-loop architectures that heretofore has been impossible to get around.

In the hold mode, the droop rate limitation of the heretofore known open-loop fast track and hold amplifiers has been imposed by the way that the voltage on the hold capacitor is undesirably discharged both by gate current drawn by the FET input stage of the unitary-gain FET output buffer and by reverse leakage currents of mismatched diodes of the diode switching bridge. For the comparatively high currents required to achieve acceptable slew rates, the temperatures of the heretofore known fast track and hold amplifiers increase towards their maximum power dissipating bound. But as the temperature increases, the gate currents of the FET input stage exponentially increase, producing correspondingly larger droop rates.

SUMMARY OF THE INVENTION

The present invention discloses as its principal object an improved fast track and hold amplifier that overcomes the limitations of the heretofore known fast track and hold amplifiers while providing highly desirable performance characteristics at power levels that heretofore have not been available. In accord therewith, means operative in the track mode are disclosed for providing a current signal having a magnitude that is representative of the amount of current necessary to drive the difference in voltage between the voltage on the hold capacitor and the voltage of the impressed analog signal to zero. In further accord therewith, means coupled to the hold capacitor and responsive to the current signal are disclosed for charging the hold capacitor up to the voltage of the impressed analog signal by a charging current whose magnitude varies as the magnitude of the current signal varies but in such a way that it preferably is a fixed number multiple greater than unity thereof. In one embodiment, the current signal providing means includes a transimpedance amplifier having a feedback path, a diode switching bridge in the feedback path of the transimpedance amplifier, and means for providing a steady-state current having a magnitude selected to bias the diodes of the diode switching bridge. In another embodiment, the current signal providing means includes a transimpedance amplifier having a feedback path and a feedback resistor in the feedback path of the transimpedance amplifier.

Insofar as the charging currents have a time-varying magnitude, the present invention makes it possible to supply a charging current magnitude that is temporarily in excess of the corresponding steady-state maximum power handling capability and thereby the present invention overcomes the limitation on the maximum available slew rate that the maximum current handling capability imposed on the heretofore known devices. Insofar as the charging currents have a magnitude that is a fixed number multiple greater than unity of the current required by the hold capacitor to charge up to the value of the voltage of the impressed analog signal, the present invention makes it possible to select values of the capacitance of the hold capacitor that are higher than those that could have been selected for the heretofore known devices while still providing the same intended slew rate. In as much as the magnitude of the steady-state bias current is comparatively much less than the steady-state current of the heretofore known fast track and hold amplifiers corresponding to maximum power handling capability, the present invention makes possible levels of quiescent power dissipation and junction temperatures that are much less than those exhibited by the heretofore known devices. With the lower junction temperatures and the larger hold capacitances, the present invention overcomes the limitations on droop rate of the heretofore known devices. In both embodiments, the current signal providing means includes a transimpedance amplifier, and the charging means includes current mirrors. The input analog signal is input to the transimpedance amplifier of the preferred embodiments, which eliminates the pole that limited the bandwidth of the heretofore known fast track and hold amplifiers and which is itself characterized by an inherently wide bandwidth.

The improved fast track and hold amplifiers of the present invention may readily be fabricated in the form of electronic chips that achieve higher speeds at lower levels of power dissipation than ever before possible. The lower level of power dissipation enables to provide smaller devices that are not limited either by the capacity or by the geometry of the package to dissipate heat. Among other applications, fast track and hold amplifiers constructed in accord with the instant invention readily lend themselves to integration with downstream analog-to-digital converters inside a single package.

BRIEF DESCRIPTION OF THE DRAWINGS

These and other objects, aspects and features of the instant invention will become apparent as the invention becomes better understood by reference to the detailed description of the preferred embodiments thereof, and to the drawings, wherein.

DETAILED DESCRIPTION OF THE PREFERRED EMBODIMENTS

Figure 1:
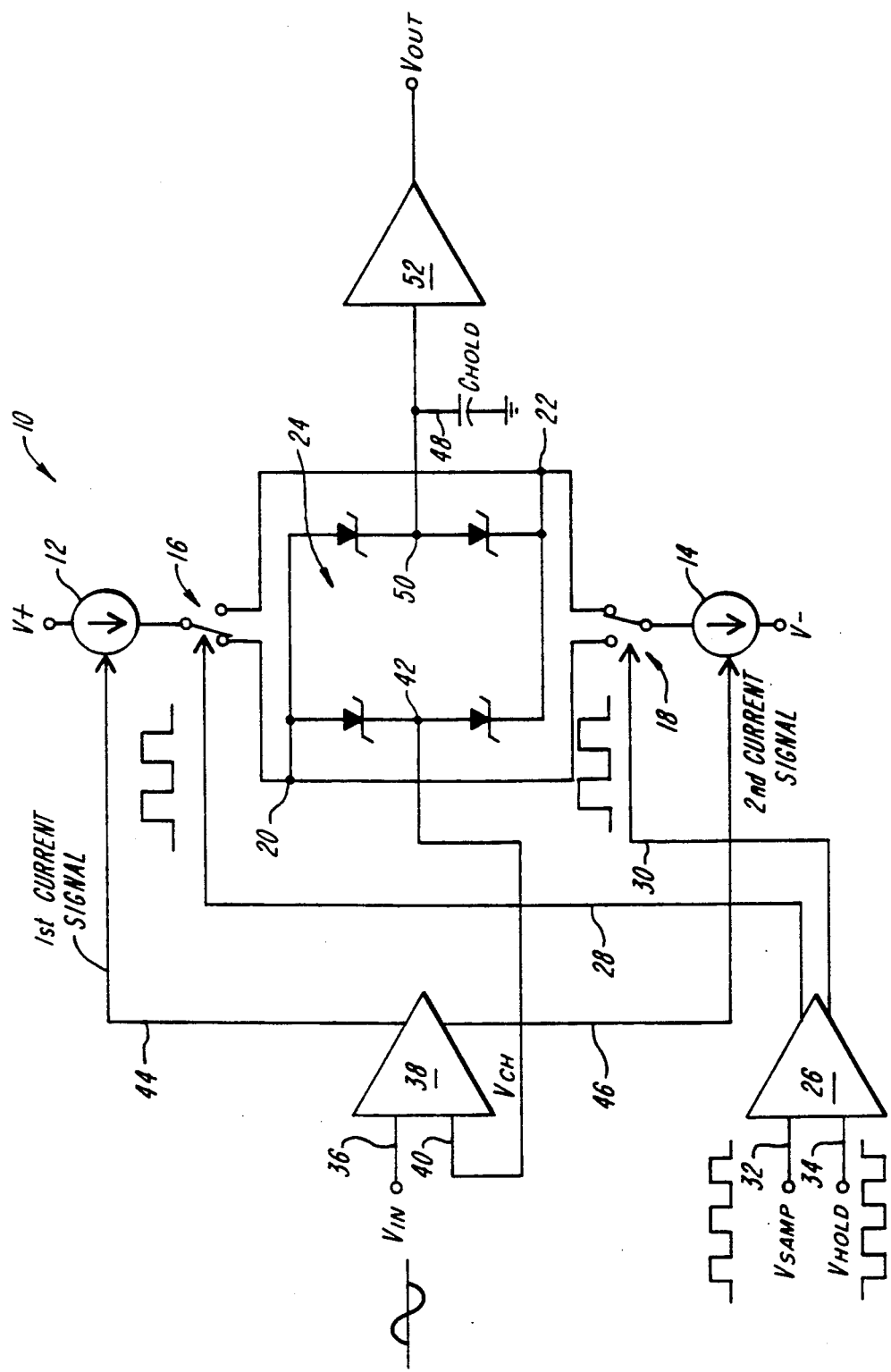
FIG. 1 is a block diagram of one embodiment of the improved fast track and hold amplifier of the present invention.

Referring now to FIG. 1, generally designated at 10 is a block diagram of one embodiment of the improved fast track and hold amplifier of the present invention. First and second current mirrors 12, 14 are respectively connected between first and second current switches generally designated 16, 18 to switching nodes 20, 22 of a diode switching bridge generally designated 24. The current switches 16, 18 are illustrated in the sample mode, and it will be appreciated that in the track mode, each of the switches 16, 18 electrically contacts the other switching node of the diode switching bridge 24, such that the current mirror 12 feeds the node 22, while the current mirror 14 feeds the node 20.

A comparator 26 is coupled to the current switches 16, 18 via switching control lines 28, 30. A signal designated "Vsamp" is impressed upon the positive input 32 of the comparator 26, and a signal designated "Vhold" is impressed on the negative input 34 of the comparator 26. The signals "Vsamp", "Vhold", pulsed in phase opposition, have levels selected to conform to the particular logic being implemented. By way of example but not by way of limitation, for TTL logic the "Vsamp" and "Vhold" signals are true for a voltage between four (4) volts and five (5) volts and are false for voltages between zero (0) volts and 0.8 volts.

The comparator 26 is operative to compare the magnitudes of the amplitudes of the pulse trains impressed to its positive and negative inputs 32, 34. Whenever the magnitude of the "Vsamp" pulse train exceeds the magnitude of the "Vhold" pulse train, the comparator 26 outputs signals via the lines 28, 30 to cause the current switches 16, 18 to assume their sample position, and when the magnitude of the "Vsamp" signal is less than the magnitude of the "Vhold" signal, the comparator 26 is operative to produce control signals over the lines 28, 30 to cause the current switches 16, 18 to assume their hold state. The frequency of the pulse trains impressed to the inputs 32, 34 of the comparator 26 is selected to implement the intended sampling rate and the hold time.

An analog signal to be tracked and held designated "Vin" is impressed to the non-inverting terminal 36 of a transimpedance amplifier 38. The inverting input 40 of the transimpedance amplifier 38 is connected to a signal node 42 of the diode switching bridge 24. The transimpedance amplifier produces control signals to be described over lines 44, 46 to the current mirrors 12, 14 respectively.

A hold capacitor 48 designated "Chold" is connected to the other signal node 50 of the diode switching bridge 24 and in parallel to an output buffer 52, such as a FET output buffer having unitary gain. The output buffer 52 preferably has a low output impedance to enable its output signal designated "Vout" to drive any downstream electronic subsystem, such as an A/D converter, and has a high input impedance to minimize droop on the charge and hold capacitor 48.

In operation, the track and hold amplifier 10 is successively operative in a sample mode and in a hold mode depending on the state of the current switches 16, 18. In the sample mode, illustrated by the FIG. 1 switch positions, the diodes of the diode switching bridge are forward-biased and the voltage appearing across the hold capacitor 48 and connected to the signal node 50 is constrained to be equal to the voltage supplied to the inverting input of the transimpedance amplifier 38 and connected to the other signal node 42 of the diode switching bridge 24. The transimpedance amplifier 38 responds to the difference in voltage between the analog signal impressed on its non-inverting input 36 and the analog signal impressed on its inverting input 40 to provide current signals over the lines 44, 46 that have a magnitude representative of the amount of current necessary to drive the difference in magnitude between the voltage of the impressed analog signal and the voltage across the capacitor 48 to zero. The current signals provided by the transimpedance amplifier 38 that have a magnitude representative of the amount of current necessary to drive the difference between the voltages impressed on its inputs to zero are the same currents that are necessary to charge the hold capacitor 48 to the voltage of the impressed analog signal. The current signals applied over the lines 44, 46 by the transimpedance amplifier 38 are amplified in the current mirrors 12, 14, and the current mirrors 12, 14, in turn, supply charge to the hold capacitor 48 with a current having a magnitude that is a fixed number multiple greater than unity of the actual current necessary to charge the hold capacitor to the same voltage as the voltage of the impressed analog signal. In the preferred embodiment, the current mirrors are factor-of-five current mirrors.

In the hold mode, where the state of the current switches 16, 18 is reversed, the diodes of the diode switching bridge 24 are reverse-biased, and the signal node 50 to which the hold capacitor 48 is connected looks like an open circuit. The feedback path through the inverting input 40 of the transimpedance amplifier 38 is thereby broken and looks like an open circuit input. The amplifier 38 tries to generate a current signal for the inverting input through the open circuit. Since, however, the transimpedance amplifier 38 does not have a current signal to amplify, it acts like a buffer between the non-inverting and inverting inputs, whereby the voltage on the hold capacitor 48 is stably maintained.

Figure 2:
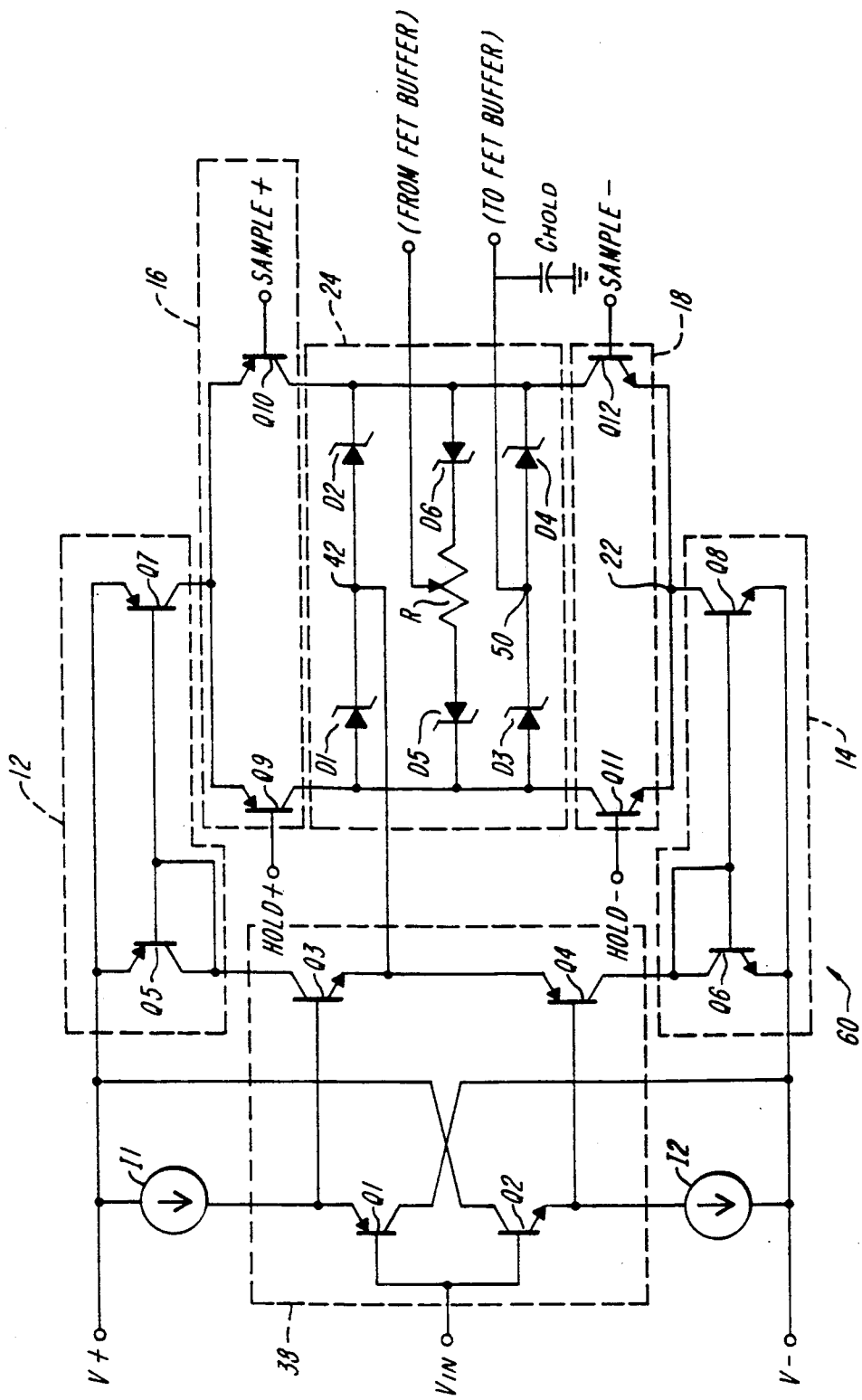
FIG. 2 is a schematic circuit diagram of the FIG. 1 embodiment of the improved fast track and hold amplifier of the present invention.

Referring now to FIG. 2, generally designated at 60 is a schematic diagram of that portion of the circuit of FIG. 1 that excludes the comparator 26, wherein like parts are designated by identical numbers. Transistors designated "Q1", "Q2", "Q3", and "Q4" make up the input stage of the transimpedance amplifier 38. The transistors designated "Q5" and "Q7" constitute the preferably gain-of-five current mirror 16, and the transistors designated "Q6" and "Q8" constitute the preferably gain-of-five current mirror 18. The diodes designated "D1", "D2", "D3", and "D4" constitute the switching diodes in the bridge configuration 24. The transistors designated "Q9" and "Q10" constitute the upper, preferably differential-pair, current switch 16 and the transistors designated "Q11" and "Q12" make up the other current switch 18. The current sources designated "I1" and "I2" are fixed current sources that set up the bias currents for the diodes of the diode switching bridge 24. The diodes designated "D5", "D6" and the center-tapped resistor designated "R" reverse-bias the diodes in the bridge 24 when the improved track and hold amplifier of the invention is in the hold mode.

When the device 60 is in the sample mode the transistors Q9 and Q12 are on, sending the current through the bridge. When an analog signal is applied to the bases of Q1 and Q2; Q3 and Q4 force the same signal to appear on their emitters, which is also the input to the diode bridge. The bridge then forces the hold capacitor to the input voltage which shows up as a current signal on the emitters of Q3 and Q4. This current signal is then amplified by the current mirrors which increase the current available to slew the hold capacitor. It may be noted that the switching transistors in the track mode become cascodes for the current mirrors, which eliminates the Miller effect capacitance that would otherwise limit the bandwidth of the amplifier driving the comparatively large capacitance that is typically desired for the hold capacitor.

When the track and hold 60 is switched into the hold mode, the transistors Q10 and Q11 turn "on", sending the current through the diodes D5, D6 and the center-tapped resistor R. This reverse-biases the bridge, effectively disconnecting both the hold capacitor and the inverting input to the transimpedance amplifier. The transimpedance amplifier tries to generate a current signal for the inverting input through the open circuit, but, since the transimpedance amplifier does not have a current signal to amplify, it acts like a buffer between the non-inverting and inverting inputs.

Figure 3:
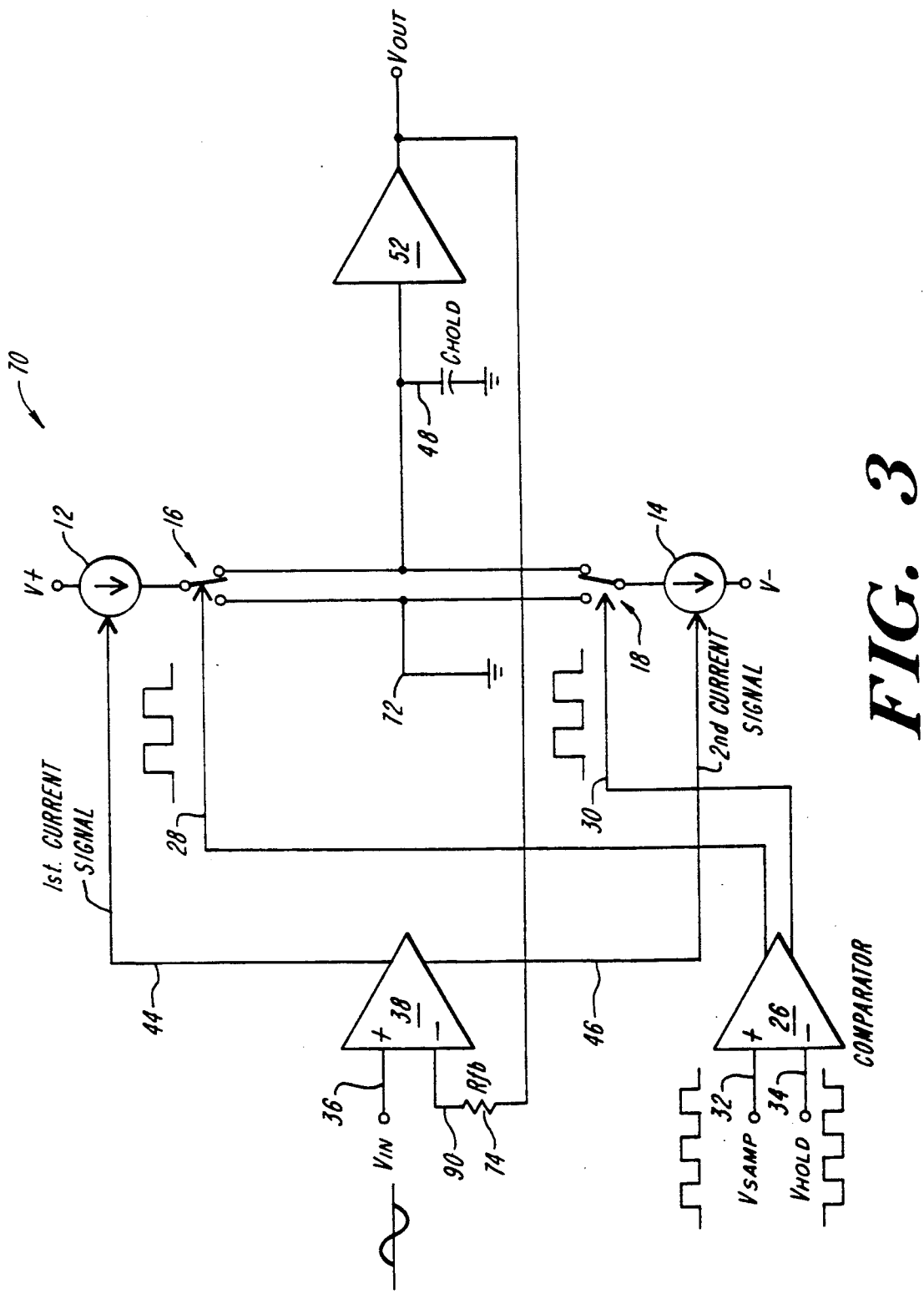
FIG. 3 is a block diagram of another embodiment of the improved fast track and hold amplifier of the present invention.

Referring now to FIG. 3, where like numbers designate the same components as in the embodiment of FIGS. and 2, generally designated at 70 is another embodiment of a improved fast track and hold amplifier in accord with the present invention. The amplifier 70 is generally the same as the amplifier 10 of FIG. 1 and the amplifier 60 of FIG. 2 except that in place of the diode switching bridge 24 thereof the current switches 16 and 18 are switched between the sample mode, as illustrated, where the current mirrors 12, 14 are electrically connected to the hold capacitor 48, and the hold mode, where the current mirrors 12, 14 are electrically connected to ground 72, and except that in place of the input 40 of the transimpedance amplifier being connected to the node 42 of the bridge 24 a resistor 74 designated "Rfb" is provided in the feedback path of the transimpedance amplifier. The gain of output buffer 52 preferably is a unitary gain, so that the output voltage, "Vout", is feedback to the input 40 of the amp 38 via the feedback resistor 74.

In the track mode, the amplifier 38 forces the non-inverting input 36 and the inverting input 40 to be equal voltages. If the output voltage, Vout, is different than the input voltage, Vin, a current is forced through the feedback resistor, "Rfb", that is proportional to the magnitude of the voltage difference. The transimpedance amplifier 38 uses this current signal and amplifies it with the current mirrors 12, 14 to charge the hold capacitor 48 up to the new voltage. The current switches 16, 18 direct the current to the hold capacitor 26 thereby connecting the input to the output.

In the hold mode, the switches 16, 18 are reversed and the charging current is directed to ground 72. Since there is no current signal to charge the capacitor, the hold capacitor 48 is disconnected from the input and the output stays at the held voltage.

One of the features of the improved fast track and hold amplifier of the present invention is the elimination of the pole that limited the available bandwidth of the heretofore known fast track and hold amplifiers. The analog voltage signal is converted to a current signal by the transimpedance amplifier. As such, the two sources of resistance, namely the bridge and buffer resistances, that formed part of the analog signal path in the heretofore known open-loop fast track and hold amplifiers, have been eliminated, and therewith the corresponding pole has been eliminated. Furthermore, the current amplification capability of the current mirrors and cooperative transimpedance amplifier of the improved fast track and hold amplifier of the present invention is inherently wide bandwidth.

Another feature of the improved fast track and hold amplifier of the present invention is the possibility of achieving slew rates for currents well above the maximum currents that were able to be accommodated by the heat dissipating capacity of the heretofore known fast track and hold amplifiers. The current amplifying transimpedance amplifier, and the cooperative current amplifying current mirrors, enable the hold capacitor to be dynamically supplied with currents at magnitudes well in excess of the heretofore maximum static current. Therewith, the improved fast track and hold amplifier of the present invention is able to achieve substantially enhanced slew rates.

A further feature of the improved fast track and hold amplifier of the present invention follows from the ability that it provides to have a current supplying the hold capacitor that is a fixed number multiple greater than unity of the actual current required to change it up to the input signal. Because the improved track and hold amplifier of the present invention dynamically supplies the hold capacitor with amplified current, as necessary, the present invention makes possible the use of larger hold capacitances for the same slew rate then heretofore possible. Yet another feature of the invention lies in its capability to be readily fabricated on chips, and its capability to be readily integrated on-chip with additional subsystems collected to provide an overall system function. The invention finds particular utility in analog-to-digital conversion.

Many modifications, changes, substitutions and equivalences of the present invention will become readily apparent to those skilled in the art, and the invention is accordingly not to be limited to the presently preferred embodiments.

What is claimed is:

1. A fast track and hold amplifier repetitively operative in a sample and in a hold mode having a hold capacitor to which a voltage is impressed during operation in the sample mode that corresponds to a voltage of an input analog signal to be sampled and at which the impressed voltage is maintained during operation in the hold mode and made available as an output signal, comprising:

first means operative in the sample mode coupled to the hold capacitor and responsive to a voltage difference defined between the voltage impressed on the hold capacitor and the voltage of the input analog signal for providing a first current signal whose magnitude is representative of how much charge the hold capacitor requires to charge up to the voltage of the input analog signal; and second means operative in the sample mode coupled to the hold capacitor and to said first means and responsive to the first current signal for charging the hold capacitor up to the voltage of the input analog signal by a second current signal whose magnitude is proportional to the magnitude of the first current signal.

2. The invention of claim 1, wherein said first means includes a transimpedance amplifier.

3. The invention of claim 2, wherein said transimpedance amplifier includes a feedback path, and wherein a diode switching bridge is connected in said feedback path of said transimpedance amplifier.

4. The invention of claim 2, wherein said transimpedance amplifier includes a feedback path, and wherein a feedback resistor is connected in said feedback path of said transimpedance amplifier.

5. The invention of claim 1, wherein said second means includes current mirrors supplying said second current signal in response to said first current signal.

6. The invention of claim 1, wherein said second current signal proportional to said first current signal is proportional by a factor that is greater than unity.

7. The invention of claim 6, wherein said factor is a fixed factor.

8. The invention of claim 1, further including means coupled to the hold capacitor and operative in the hold mode for electrically disconnecting the hold capacitor from the input analog signal in order to allow the same to maintain the voltage impressed thereto.

9. The invention of claim 8, wherein said electrically disconnecting means includes a diode switching bridge having constitutive diodes, and means for reverse biasing the constitutive diodes of the diode switching bridge.

10. The invention of claim 8, wherein said electrically disconnecting means includes current switches.

11. An improved fast track and hold amplifier operative in a sample mode to track an input analog signal and in a hold mode to store the same, comprising:

a diode switching bridge having two switching nodes and two signal nodes;

a transimpedance amplifier having a first input to which the analog signal to be sampled and held is input and a second input;

a hold capacitor;

said hold capacitor being connected to one signal node of said diode switching bridge and said other signal node of said diode switching bridge being connected to said second input of said transimpedance amplifier;

first and second current mirrors;

said transimpedance amplifier having first and second current outputs;

said first and second current outputs of said transimpedance amplifier being respectively connected to said current mirrors;

said first and second current mirrors being connected to respective ones of said first and second switching nodes of said diode switching bridge;

said diode switching bridge being constituted of plural diodes; and means connected to said diode switching bridge and cooperative with said current mirrors for selectively biasing said diodes between a forward-bias condition and a reverse-bias condition corresponding to operation in said sample mode and said track mode.

12. The invention of claim 11, wherein said transimpedance amplifier has an inverting and a non-inverting input, and wherein said first input is the non-inverting and said second input is the inverting input of the transimpedance amplifier.

13. The invention of claim 11, wherein said means includes a comparator.

14. The invention of claim 11, wherein said means includes a current pair of switches.

15. The invention of claim 14, wherein said current switches is a differential-pair current switch.

16. The invention of claim 11, wherein said current mirrors are fixed-gain current mirrors.

17. The invention of claim 11, wherein said means includes fixed current sources for providing steady-state bias currents for said diodes of said diode switching bridge.

18. An improved fast track and hold amplifier operating in a sample mode to track an input analog signal and in a hold mode to store the same, comprising:

a hold capacitor;

first and second current mirrors;

switching means coupled to the hold capacitor and to the current mirrors for electrically connecting the first and second current mirrors to the hold capacitor in the sample mode and for electrically connecting the hold capacitor to ground in the hold mode;

a transimpedance amplifier having a first input to which the analog signal is input and a second input;

said transimpedance amplifier having first and second current outputs;

said first and second current outputs of said transimpedance amplifier being respectively connected to said first and second current mirrors;

an output buffer having an input connected to said hold capacitor;

said output buffer having an output;

a feedback resistor;

said feedback resistor being connected to said output of said output buffer and to said second input of said transimpedance amplifier.

19. The invention of claim 18, wherein said first input of the transimpedance amplifier is a non-inverting input and said second input is an inverting input.

20. The invention of claim 18, wherein said output buffer has unitary gain.

21. The invention of claim 18, wherein said current mirrors are fixed-gain current mirrors.

22. A fast track and hold amplifier repetitively operative in a sample and in a hold mode respectively to track an input analog signal having a voltage and to make the same available as an output signal, comprising:

a hold capacitor having a voltage; and first means operative in the sample mode coupled to the hold capacitor and responsive to a voltage difference defined between the voltage on the hold capacitor and the voltage of the input analog signal for providing a first current signal whose magnitude is representative of how much charge the hold capacitor requires to charge up to the voltage of the input analog signal.

23. The invention of claim 22, further including second means operative in the sample mode coupled to the hold capacitor and to said first means and responsive to the first current signal for charging the hold capacitor up to the voltage of the input analog signal by a second current signal whose magnitude is proportional to the magnitude of the first current signal.

24. The invention of claim 23, wherein said second current signal proportional to said first current signal is proportional by a factor that is greater than unity.

25. The invention of claim 24, wherein said factor is a fixed factor.

26. A method for charging a hold capacitor of a track and hold amplifier to a voltage that is the same as the voltage of an analog signal to be tracked and held, comprising the steps of:

producing a hold capacitor charging current that is proportional to the difference between the voltage on the hold capacitor and the voltage of an impressed analog signal;

wherein said producing step includes the steps of using a transimpedance amplifier to produce a first charging current proportional to the difference and the step of using a current amplifier to produce said hold capacitor charging current by current amplification of said first charging current.

27. The invention of claim 26, wherein the current proportional to the difference is proportional by a factor greater than unity.

28. The invention of claim 27, wherein the factor is a fixed factor.

* * * * *

UNITED STATES PATENT AND TRADEMARK OFFICE
CERTIFICATE OF CORRECTION

PATENT NO. : 5,124,576
DATED : June 23, 1992
INVENTOR(S) : Russell H. Jensen

It is certified that error appears in the above—identified patent and that said Letters Patent is hereby corrected as shown below:

Column 6, line 45, "a" should read --an--.

Column 9, line 18, "a current pair of switches" should read --a pair of current switches--.

Signed and Sealed this

Fourth Day of January, 1994

*Attest:*

BRUCE LEHMAN

*Attesting Officer*    *Commissioner of Patents and Trademarks*